United States Patent
Mitsui et al.

(10) Patent No.: US 7,141,339 B2
(45) Date of Patent: Nov. 28, 2006

(54) PROCESS FOR MANUFACTURING HALF-TONE PHASE SHIFTING MASK BLANKS

(75) Inventors: Masaru Mitsui, Yamanashi (JP); Toshiyuki Suzuki, Yamanashi (JP); Shigenori Ishihara, Yamanashi (JP)

(73) Assignee: Hoya Corporation, Tokyo (JP)

( * ) Notice: Subject to any disclaimer, the term of this patent is extended or adjusted under 35 U.S.C. 154(b) by 81 days.

(21) Appl. No.: 10/689,527

(22) Filed: Oct. 21, 2003

(65) Prior Publication Data

US 2004/0110072 A1    Jun. 10, 2004

(30) Foreign Application Priority Data

Oct. 23, 2002    (JP)    ............................. 2002-308345

(51) Int. Cl.
*G03F 1/00*    (2006.01)
*C23C 14/00*    (2006.01)

(52) U.S. Cl. ...................... 430/5; 204/192.12
(58) Field of Classification Search ................ 430/5, 430/322, 324; 204/192.12; 427/595
See application file for complete search history.

(56) References Cited

U.S. PATENT DOCUMENTS

| | | | |
|---|---|---|---|
| 5,942,356 A | 8/1999 | Mitsui et al. | |
| 6,153,341 A | 11/2000 | Mitsui et al. | |
| 6,511,778 B1 * | 1/2003 | Okazaki et al. | ................. 430/5 |
| 6,783,634 B1 | 8/2004 | Nozawa et al. | |

* cited by examiner

*Primary Examiner*—S. Rosasco
(74) *Attorney, Agent, or Firm*—Nixon & Vanderhye P.C.

(57) ABSTRACT

For efficiently manufacturing half-tone phase shifting mask blanks having uniform product qualities, which enables the prevention of optical property variations when the blanks are mass-produced, there is provided a process for manufacturing half-tone phase shifting mask blanks each having a phase shifting film containing at least one half-tone film on a transparent substrate, comprising the step of providing a target containing a metal and silicon, and carrying out reactive sputtering in an atmosphere containing a reactive gas, to form said half-tone film on said transparent substrate, wherein the formation of the half-tone film by said reactive sputtering is carried out using, as said target, a target having a metal/silicon compositional ratio selected so as to give a predetermined optical property of the half-tone film, at a reactive gas flow rate selected from a region where a discharge characteristic is stabilized against a change in the flow rate of the reactive gas.

25 Claims, 5 Drawing Sheets

PROCESS FOR MANUFACTURING HALF-TONE PHASE SHIFTING MASK BLANKS

FIELD OF THE INVENTION

The present invention relates to a process for manufacturing half-tone phase shifting mask blanks, half-tone phase shifting mask blanks and half-tone phase shifting masks. More specifically, the present invention relates to a process for manufacturing half-tone phase shifting mask blanks, which enables the prevention of optical property variations when the blanks are mass-produced, half-tone phase shifting mask blanks obtained by the above process and half-tone phase shifting masks manufactured from the above mask blanks.

PRIOR ART

In the conventional manufacture of semiconductor devices such as IC and LSI, there has been carried out micro-processing by photolithography using a photoresist composition. In the micro-processing, a thin film of a photoresist composition is formed on a substrate such as a silicon wafer, the photoresist composition is exposed to an actinic ray such as ultraviolet ray through a mask having a pattern and then developed to obtain a resist pattern, and the substrate is etched using the resist pattern as a protective film.

In recent years, however, the integration degree of semiconductor devices is rapidly enhanced, and the manufacture of very large scale integrated circuits, or the like requires the processing accuracy of an ultrafine pattern in a submicron or quarter micron region. Since conventional ultraviolet ray used as an exposure light source has a limit imposed by its wavelength, therefore, the wavelength of ray for exposure tends to be decreased, and g-beam, i-beam and far ultraviolet beams such as deep-UV and excimer laser beam have to be used for carrying out the exposure.

Meanwhile, with regard to DRAM (dynamic random access memory), the framework of their mass production for 256 megabits has been established at present, and the integration degree is further being enhanced from a megabit class to a gigabit class. The design rule of integrated circuits is accordingly being minimized, and it has come to be an immediate problem to cope with demands for a fine pattern having a line width (half pitch) of 0.10 µm or less.

As one means of coping with the minimizing of a pattern in size, higher resolution of patterns has been so far forwarded by decreasing the wavelength of an exposure light source as described above. As a result, KrF excimer laser beam (248 nm) and ArF excimer laser beam (193 nm) have come to be mainly used as an exposure light source in current photolithography, and further, the application of $F_2$ excimer laser beam (157 nm) is being studied.

However, on one hand, the above decrease in the wavelength of exposure light improves the resolution, but on the other hand, the depth of focus decreases, so that there are caused undesirable events such as an increase in a burden on the design of optical systems including a lens and a decrease in process stability.

For coping with the above problems, a phase shifting lithography method has come to be employed. The phase shifting lithography method is a method for improving the resolution of photolithography by only modifying a mask without modifying an optical system, and in this method, exposure beams passing through a photomask are provided with a phase difference, so that the resolution can be remarkably improved on the basis of an interference between the beams being transmitted. The above phase shifting lithography method uses a phase shifting mask as a mask for transfer a micro-pattern.

The above phase shifting mask is composed, for example, of a phase shifter portion forming a pattern portion on a mask and a non-pattern portion where no shifter portion is present. The phases of beams passing through the above two portions are shifted from each other by 180°, to cause mutual interferences of the beams in the boundary of the pattern, whereby a transferred image is improved in contrast. It is known that the phase shifting amount φ (rad) of beam passing through the phase shifter portion depends upon the real part of complex refractive index (n) of the phase shifter portion and a film thickness (d) and that the relationship of the following expression is established.

$$\varphi = 2\pi d(n-1)\lambda \quad (1)$$

wherein λ is a wavelength of an exposure beam.

For shifting the phase by 180°, therefore, the film thickness d can be determined to be as follows.

$$d = \lambda/\{2(n-1)\} \quad (2)$$

The above phase shifting mask can attain an increase in the depth of focus for obtaining a necessary resolution, and it can simultaneously improve the resolution and the application of the process without changing the wavelength of exposure beam.

Depending upon light transmissivity of a phase shifter portion forming a mask pattern, practically, the phase shifting mask can be largely classified into a complete transmission type (Levenson type) phase shifting mask and a half tone phase shifting mask. The former is a mask in which the light transmissivity of the phase shifter portion is equivalent to the light transmissivity of the non-pattern portion (light transmission portion) and which is nearly transparent to the wavelength of exposure beam. It is generally said to be effective for transferring a line and a space. In the later half-tone type, the light transmissivity of the phase shifter portion (light semi-transmission portion) is several to tens percent of the light transmissivity of the non-pattern portion (light transmission portion), and it is said to be effective for making a contact hole and an isolated pattern.

The half-tone phase shifting mask includes a two-layered half-tone phase shifting mask composed of a layer for mainly adjusting the transmissivity and a layer for mainly adjusting the phase, and a single-layered half-tone phase shifting mask that has a simple structure and is easy to manufacture.

At present, the mainstream is a half-tone phase shifting mask whose half-tone phase shifter portion is composed of a single layer made of an MoSiN film or MoSiON film.

Generally, the above MoSiN film or MoSiON film is formed by a reactive sputtering method using an MoSi target in a sputtering atmosphere containing an inert gas and reactive gases such as $O_2$, $N_2$, $NO_2$ and the like. As an MoSi target, typically, a target having an Mo:Si amount ratio of 1:2 (molar ratio) is used. The MoSi-containing film generally tends to show a smaller transmissivity with a decrease in wavelength, and due to a decrease in the wavelength of an exposure beam, there is therefore employed a method in which an MoSi target having a silicon content of 70 to 95 mol % is used for obtaining a material film having a larger transmissivity (for example, see Japanese Patent 2989156). Conventionally, the flow rate of a reactive gas is controlled, and optionally, the composition of a target is controlled, for obtaining a film having intended optical properties corresponding to the wavelength of a predetermined exposure beam.

With minimizing LSI patterns, there have been practically used as the exposure light source (wavelength of exposure beam), i-ray (367 nm) and KrF excimer laser beam (248 nm), and recently ArF excimer laser beam (193 nm) have come to be practically used. There are accordingly demanded half-tone phase shifting masks having phase shifting films having optical properties (transmissivity and phase difference) suitable for the wavelengths of exposure beams such as i-ray, KrF excimer laser beam and ArF excimer laser beam. In the mainstream of currently available half-tone phase shifting masks, films are designed such that their half-tone phase shifter portions have an exposure beam transmissivity of about 6%. However, half-tone phase shifting masks having a higher transmissivity are being required for far higher resolutions, and there are increased demands for half-tone phase shifting mask blanks having various transmissivity properties such as a transmissivity of 9%, 15%, or the like.

In the optical properties of half-tone phase shifting mask blanks, conventionally, it has been required to control the transmissivity variation to be ±1% and control the phase shifting amount to be ±5°. In recent years, however, it has come to be required to attain a transmissivity variation of ±0.4%, desirably, ±0.2% and a phase shifting amount variation of ±4°, desirably, ±2°. With a decrease in the wavelength of an exposure beam, however, it tends to be still more difficult to control the above variations to be in the above tolerable ranges. When the above various kinds of half-tone phase shifting mask blanks having various optical properties are manufactured with one mass-production apparatus, it has been difficult to set film-forming conditions under which the optical properties do not vary with regard to the optical properties of each kind.

SUMMARY OF THE INVENTION

It is an object of the present invention to provide a process for efficiently manufacturing half-tone phase shifting mask blanks while preventing variations of optical properties among the blanks in commercial mass production so that the blanks have uniform qualities; half-tone phase shifting mask blanks manufactured by the above process; and half-tone phase shifting masks manufactured from the above mask blanks.

For achieving the above object, the present inventors have made diligent studies and as a result found the following. When a half-tone film is formed on a transparent substrate by sputtering a target containing a metal and silicon in an atmosphere containing a reactive gas to manufacture half-tone phase shifting mask blanks each having a phase shifting film containing at least one half-tone film on the transparent substrate, the above half-tone film is formed under certain conditions as will be explained later, whereby there can be efficiently manufactured half-tone phase shifting mask blanks whose optical property variations in mass production are prevented. On the basis of this finding, the present invention has been completed.

That is, according to the present invention, there are provided;

(1) a process for manufacturing half-tone phase shifting mask blanks each having a phase shifting film containing at least one half-tone film on a transparent substrate, comprising the step of providing a target containing a metal and silicon, and carrying out reactive sputtering in an atmosphere containing a reactive gas, to form said half-tone film on said transparent substrate, wherein the formation of the half-tone film by said reactive sputtering is carried out using, as said target, a target having a metal/silicon compositional ratio selected so as to give a predetermined optical property of the half-tone film, at a reactive gas flow rate selected from a region where a discharge characteristic is stabilized against a change in the flow rate of the reactive gas, (2) a process for manufacturing a plurality of types of half-tone phase shifting mask blanks each of which has a phase shifting film containing at least one half-tone film on a transparent substrate, the half-tone film of each blank having a different optical property, comprising the step of providing targets containing a metal and silicon and carrying out reactive sputtering in an atmosphere containing a reactive gas, to form said half-tone film on said transparent substrate, wherein the formation of the half-tone film by said reactive sputtering is carried out using a targets selected from a plurality of targets having different metal/silicon compositional ratios so as to give desired different half-tone film optical properties among the mask blanks, at a reactive gas flow rate selected from a region where a discharge characteristic is stabilized against a change in the reactive gas flow rate, (3) the process as recited in the above (1) or (2), wherein the reactive gas is at least one member selected from the group consisting of nitrogen, oxygen, fluorine and compounds of these, (4) half-tone phase shifting mask blanks manufactured by the process recited in the above (1), (2) or (3), and (5) half-tone phase shifting masks manufactured from the half-tone phase shifting mask blanks recited in the above (4).

The "process for manufacturing phase shifting mask blanks" in the above (1) and (2) should be interpreted in a broad sense, and the process is to include a process for mass-producing phase shifting mask blanks.

PREFERRED EMBODIMENTS OF THE INVENTION

Figure 1:
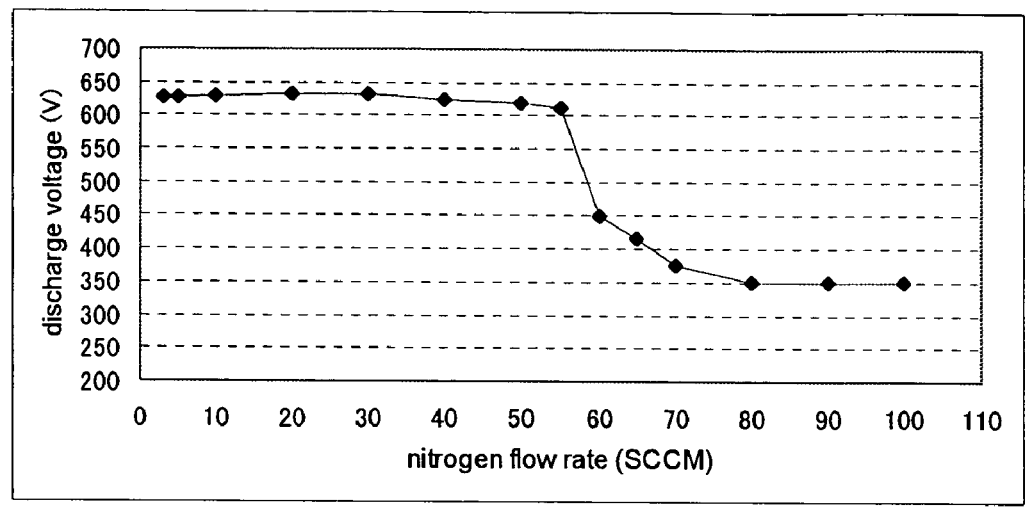
FIG. 1 is a graph showing an example of a relationship between a nitrogen gas flow rate and a discharge voltage when sputtering is carried out at a constant electric power.

The process for manufacturing a half-tone phase shifting mask blanks, provided by the present invention, is a process for manufacturing half-tone phase shifting mask blanks each having a phase shifting film containing at least one half-tone film on a transparent substrate. The above phase shifting film has a single-layered structure or a multi-layered structure of two or more layers. The reactive sputtering is carried out using a target containing a metal and silicon in an atmosphere containing a reactive gas, to form the phase shifting film containing at least one half-tone film.

The phase shifting film having a single-layered structure formed of a half-tone film includes, for example, a film composed of a material containing a metal, silicon and at least one member selected from the group consisting of oxygen, nitrogen, fluorine, carbon and hydrogen. Examples of the above metal include molybdenum, tantalum, tungsten, chromium, titanium, nickel, palladium, hafnium and zirconium.

The phase shifting film having a multi-layered structure includes, for example, a phase shifting film formed by stacking two or more of the above single-layered half-tone films and a phase shifting film formed by stacking the above single-layered half-tone film and a transmissivity-adjustment layer such as a metal layer containing at least one member selected from the group consisting of chromium, tantalum, hafnium, magnesium, aluminum, titanium, vanadium, yttrium, zirconium, niobium, molybdenum, tin, lanthanum, tungsten and silicon.

For producing a phase shifting effect, the phase shifting film of the present invention is set such that the phase difference is approximately 180°.

The above reactive gas is at least one member selected from nitrogen, oxygen, carbon, fluorine and compounds of these. Specifically, at least one of $O_2$, $N_2$, $NO_2$, $N_2O$, $CH_4$, $CO_2$, $CF_4$ and the like can be used. In the reactive sputtering, a sputtering gas (inert gas) used in combination with the above reactive gas includes, for example, Ar, He, Xe and mixtures of these gases.

The material for the above transparent substrate is not critical, and can be selected from those that are conventionally used as a material for a transparent substrate of a half-tone phase shifting mask blanks. Examples of the above material include soda-lime glasses such as soda-lime glass and white crown; low-expansion glasses such as borosilicate glass, alkali-free glass and aluminosilicate glass; quartz glasses such as synthetic quartz and plastic films such as a polyester film. Of these, soda-lime glass and quartz glass are preferred as a material for a substrate for masks for LSI and LCD.

In the process of the present invention, the greatest feature is that the formation of the half-tone film by reactive sputtering is carried out using, as the target, a target having a metal/silicon compositional ratio selected so as to give a predetermined optical property of the half-tone film, at a reactive gas flow rate selected from a region where a discharge characteristic is stabilized against a change in the flow rate of the reactive gas. When a plurality of kinds of half-tone phase shifting mask blanks having half-tone films having different optical properties among the mask blanks are mass-produced, there are used a target selected from a plurality of targets having different metal/silicon compositional ratios so as to give predetermined different optical properties of the half-tone films among the mask blanks.

The above "region where a discharge characteristic is stabilized" refers to a region where the discharge current or discharge voltage does not show a substantial change with regard to a change in the flow rate of the reactive gas when the sputtering is carried out at a constant voltage. When the sputtering is carried out at a constant current, it refers to a region where the discharge electric power or discharge voltage does not show a substantial change with regard to a change in the flow rate of the reactive gas. Specifically, it refers to a region where a change in the discharge voltage is within about 20 V when the flow rate of the reactive gas changes by 10 SCCM (standard state $cm^3/min$).

FIG. 1 is a graph showing an example of a relationship between a nitrogen gas flow rate and a discharge voltage when sputtering is carried out at a constant electric power using a target containing a molybdenum and silicon in a molybdenum: silicon molar ratio of 20:80, in which the electric power is constantly maintained at 2 kW and argon (Ar: 10 SCCM) and nitrogen are used as a sputtering atmosphere. The graph shows a change in discharge voltage relative to a change in the flow rate of nitrogen. As shown in FIG. 1, there are regions where the discharge voltage shows a small change relative to a change in the flow rate of nitrogen, or the discharge characteristic is stabilized. That is, in FIG. 1, there are a stable region where the discharge voltage is approximately 620 to 630 V at a nitrogen flow rate of approximately 55 SCCM or lower and a stable region where the discharge voltage is approximately 350 V at a nitrogen flow rate of approximately 80 SCCM or greater.

A change in the discharge characteristic, such as a voltage, has a great influence on the variation of the optical properties, so that the nitrogen flow rate is selected from a region where the discharge voltage is not changed. In FIG. 1, there are two stable regions. In view of the performances (transmissivity and phase difference) of half-tone films to be formed, however, it is preferred to set the nitrogen flow rate on the basis of the later stable region where the discharge voltage is approximately 350 V.

FIG. 1 shows one embodiment of the sputtering at a constant electric power where a target containing molybdenum and silicon is used, nitrogen is used as a reactive gas and argon is used as a sputtering gas. However, the above is also applicable to cases where a target having a different molybdenum/silicon molar ratio or a target containing other metal and silicon is used, other reactive gas or other sputtering gas is used, or sputtering is carried out at a constant current.

Then, a plurality of targets having different metal/silicon compositional ratios are provided, and there is selected a target having a metal/silicon compositional ratio that gives a predetermined optical property when the gas flow rate determined above is employed. According to experiments made by the present inventors, it has been found that an extinction coefficient of the half-tone film material can be controlled when the compositional ratio of the target is finely adjusted, for example, adjusted at intervals of 0.1 mol % or less.

Therefore, under the gas flow conditions selected from a region where the discharge characteristic is stabilized, targets having compositional ratios changed at intervals of 1 mol % or the like are used to form half-tone films such that the half-tone films give a predetermined phase difference (180° in the case of a single layer), and the half-tone films are measured for transmissivity. In this manner, the compositional ratio of the target that gives a predetermined transmissivity is determined.

For obtaining a material having high transmissivity, the compositional ratio of the target is preferably selected from compositions having a far larger silicon content than a metal silicide composition having a high silicon content among stoichiometrically stable metal silicides. More specifically, the compositional ratio is preferably selected from compositions having a silicon content of 70 to 95 mol %. When the silicon content is less than 70 mol %, it is difficult to obtain a material having high transmissivity. For using a beam having a shorter wavelength than that of a KrF excimer laser, the content of silicon is preferably 78 mol % or more, and for using a beam having a shorter wavelength than that of an ArF excimer laser, the content of silicon is preferably 85 mol % or more. When the silicon content exceeds 95 mol %, the discharge stability during DC sputtering may be impaired.

As described above, the reactive sputtering is carried out using, as a target, a target having a metal/silicon compositional ratio selected so as to give a predetermined optical property, at a reactive gas flow rate selected from a region where the discharge characteristic is stabilized against a change in the reactive gas flow rate, whereby there can be formed a half-tone film having a predetermined phase angle and transmissivity, in which the variations thereof are small, that is, the variation of the phase angle is generally within ±4°, preferably within ±2° and the variation of the transmissivity is generally within ±0.4%, preferably within ±0.2%.

As a method of mass-producing half-tone phase shifting mask blanks in the present invention, there can be employed any one of a single-substrate system and an in-line continuous blank manufacturing method.

First, the single-substrate system will be explained.

Figure 2:
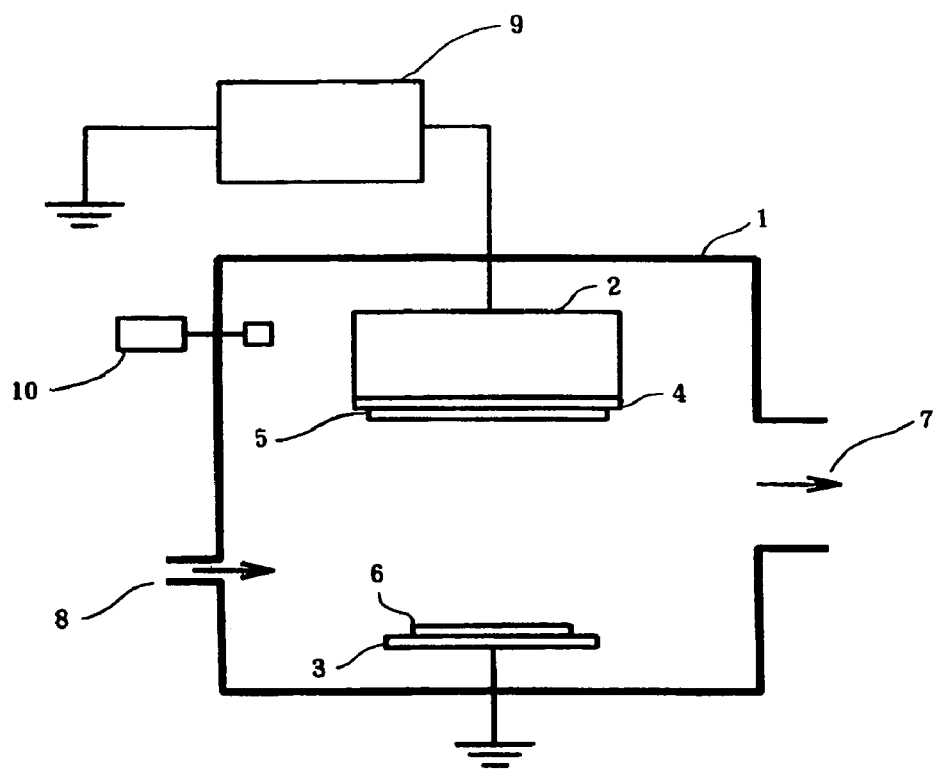
FIG. 2 is a schematic drawing of an example of a DC magnetron sputtering apparatus for manufacturing a half-tone phase shifting mask blanks according to a single-substrate system.

FIG. 2 shows a schematic drawing of an example of a DC magnetron sputtering apparatus for manufacturing half-tone phase shifting mask blanks by a single-substrate system.

The DC magnetron sputtering apparatus has a vacuum chamber 1, and a magnetron cathode 2 and a substrate holder 3 are disposed inside the vacuum chamber 1. A backing plate 4 is attached to the magnetron cathode 2, and a sputtering target 5 is attached to the backing plate 4. The backing plate 4 is cooled directly or indirectly with a water-cooling system (not shown). The magnetron cathode 2, the backing plate 4 and the sputtering target 5 are electrically connected. A transparent substrate 6 is attached to the substrate holder 3.

The vacuum chamber 1 is discharged with a vacuum pump through a discharge port 7. After the atmosphere in the vacuum chamber reaches a vacuum degree at which the properties of a film to be formed are no longer affected, a gas mixture containing nitrogen is introduced through a gas introduction port 8, and a negative voltage is applied to the magnetron cathode 2 with a DC power source 9, to carry out sputtering. The pressure inside the vacuum chamber 1 is measured with a pressure gauge 10.

The transparent substrate is introduced into the vacuum chamber 1, and after a thin film is formed thereon by sputtering in the vacuum chamber 1, the thus-manufactured phase shifting mask blank is carried out of the above vacuum chamber 1. The above series of process is consecutively carried out with regard to each of a plurality of transparent substrates, and the transparent substrates are introduced at nearly constant intervals and the mask blanks are carried out of the vacuum chamber at nearly constant intervals, whereby the time period for forming a film can be made constant among a plurality of mask blanks.

Figure 3:
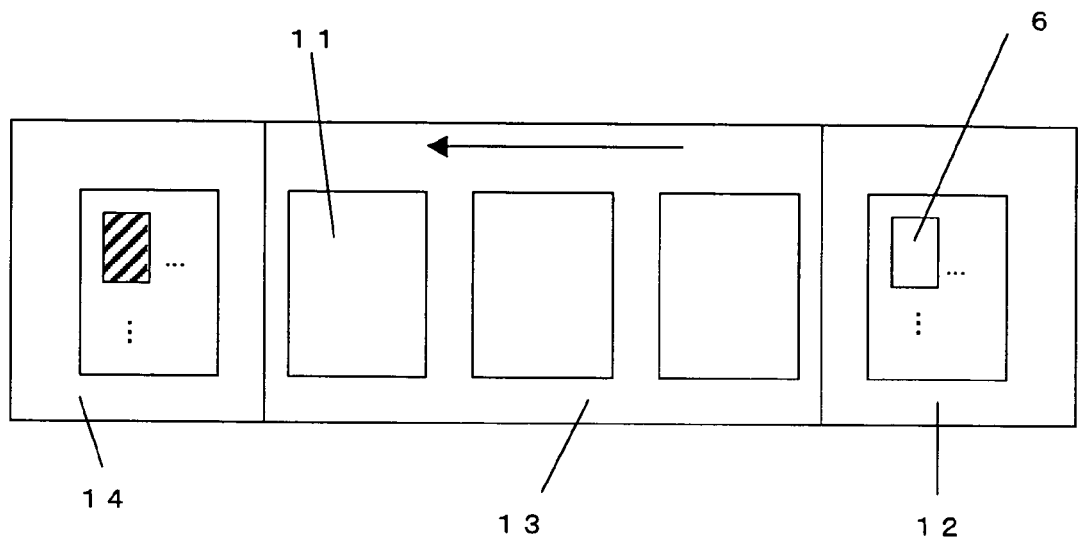
FIG. 3 is a schematic drawing of an example of an sputtering apparatus for manufacturing half-tone phase shifting mask blanks according to an in-line continuous blank manufacturing method.

The in-line continuous blank manufacturing method will be explained below. FIG. 3 is a schematic layout of an example of a sputtering apparatus for manufacturing half-tone phase shifting mask blanks by an in-line continuous blank manufacturing method.

In the sputtering apparatus shown in FIG. 3, the formation of films on a plurality of transparent substrates 6 placed on a pallet 11 is continuously carried out, and a series of film formations are carried out while the pallets are transported in one vacuum chamber with changing supply amounts of reactive gases ($O_2$, $N_2$, etc/) in the transportation direction. In this case, therefore, a multi-layered film can be formed in one chamber (having one vacuum degree) by sputtering. Further, a plurality of mask blanks can be simultaneously formed in one chamber. In FIG. 3, reference numeral 12 indicates an introduction chamber, numeral 13 indicates a sputtering chamber, and numeral 14 indicates a recovery chamber.

According to the process of the present invention, half-tone phase shifting mask blanks each having an optical property of which the variations are controlled and having a uniform product quality can be efficiently manufactured when mass-produced.

According to the present invention, further, there is provided half-tone phase shifting mask blanks manufactured by the above process, and there is also provided half-tone phase shifting masks manufactured from the above mask blanks.

The half-tone phase shifting masks of the present invention can be manufactured by providing mask blanks each having a phase shifting film containing at least one half-tone film formed by the above process, on a transparent substrate, patterning the phase shifting film to remove part thereof according to a predetermined pattern, and thereby forming a mask pattern constituted of a light semi-transmitting portion and a light transmitting portion.

The method of the above patterning is not specially limited, and there can be employed any method which is known in the manufacturing of conventional half-tone phase shifting masks. For example, an electron beam resist film is formed on the phase shifting film of a mask blanks, and the resist film is irradiated with electron beam according to a predetermined pattern. Thereafter, the resist is developed to form a resist pattern, and then the phase shifting film is dry-etched with using the resist pattern as a mask, and the remaining resist pattern is peeled off (removed), to obtain half-tone phase shifting masks each having a light semi-transmitting portion and a light transmitting portion, provided by the present invention.

EXAMPLES

The present invention will be explained more in detail with reference to Examples hereinafter, while the present invention shall not be limited by these Examples.

Example 1

A single-layered light semi-transmitting film composed substantially of molybdenum, silicon and nitrogen was formed on a transparent substrate with a DC magnetron sputtering apparatus shown in FIG. 2 by a single blank manufacturing method as described below. In this manner, 250 half-tone phase shifting mask blanks for KrF excimer laser beam (248 nm) were manufactured.

As a sputtering target, a target having an Mo:Si molar ratio of 20.0:80.0 was used, and as a sputtering gas, a gas mixture containing argon, nitrogen and helium was used (gas flow rate: Ar=10 SCCM, $N_2$=80 SCCM, He=40 SCCM). The light semi-transmitting films were formed such that the phase angles of the light semi-transmitting films were adjusted to about 180° in the wavelength of a KrF excimer laser beam. The above gas flow conditions were selected from a region where the discharge characteristic was stabilized.

The blanks were then heat-treated at 250° C. for 30 minutes in a heat-treatment apparatus.

Figure 6:
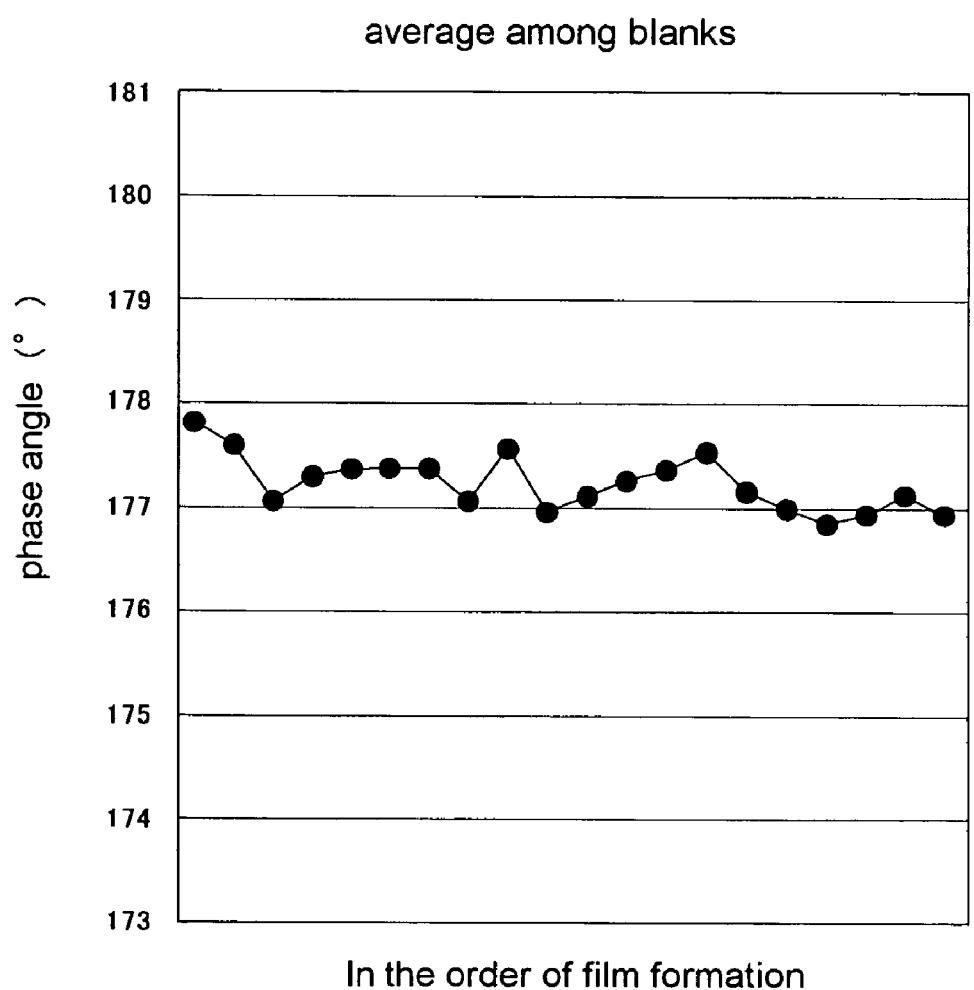
FIG. 6 is a graph showing variations of phase angles among half-tone phase shifting mask blanks obtained in Example 2.
Figure 7:
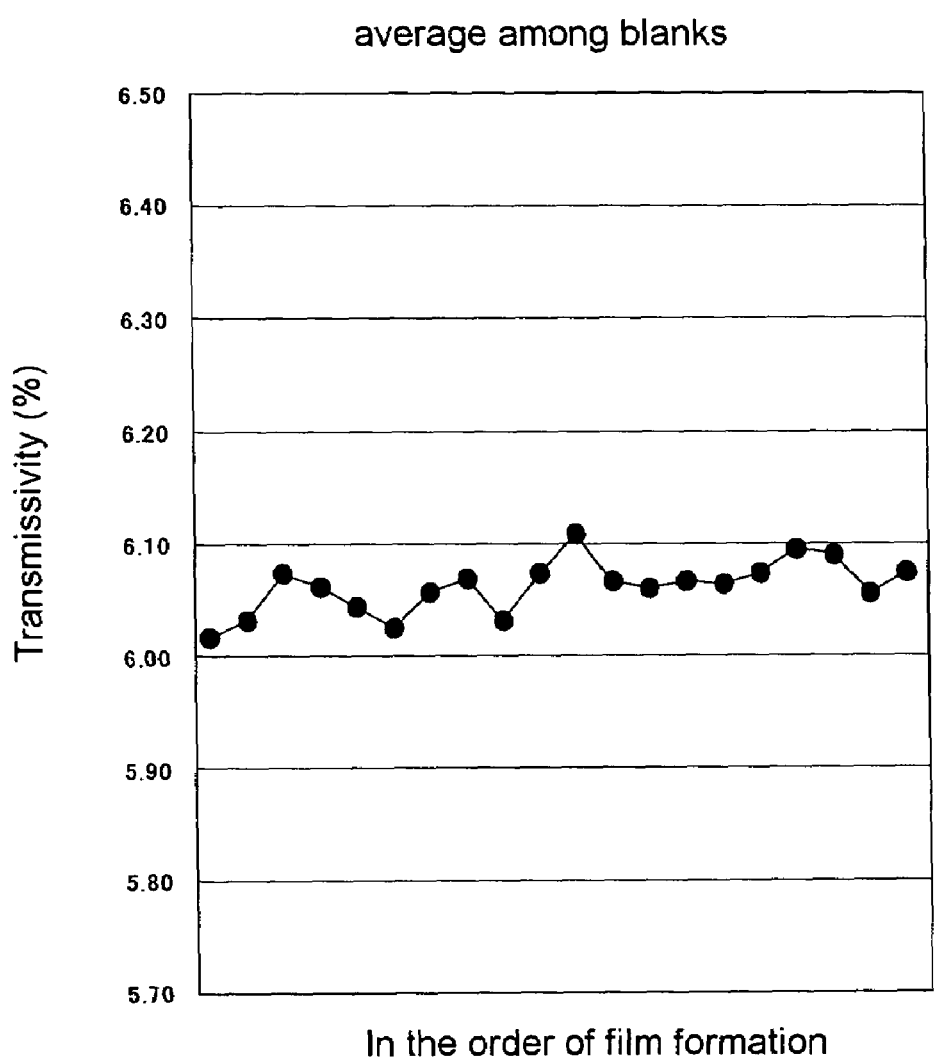
FIG. 7 is a graph showing variations of transmissivity among half-tone phase shifting mask blanks obtained in Example 2.

The above phase shifting mask blanks (having a 15.2 cm×15.2 cm square form) were evaluated for variations of phase angles and transmissivity in the wavelength of the KrF excimer laser beam. In the measurement (evaluation), an average value of data in arbitrary 6 points in a measurement area having a 13.2 cm×13.2 cm square form was taken as a cm×15.2 cm square form) were evaluated for variations of phase angles and transmissivity in the wavelength of the ArF excimer laser beam in the same manner as in Example 1. FIGS. 6 and 7 show the results. These figures show that the variation of the phase angle among the blanks was within ±1° and that the variation of the transmissivity among the blanks was within ±0.1%. In this Example, there were mass-produced half-tone phase shifting mask blanks each having a stable optical property for ArF excimer laser beam.

In the above Examples, when a plurality of half-tone phase shifting mask blanks for the wavelengths of different exposure beam are manufactured, the gas condition excellent in discharge stability is fixed, and the composition of the target is modified, whereby half-tone phase shifting mask blanks each having a different optical property can be mass-produced in one and the same apparatus.

Comparative Example 1

For comparison, the same apparatus as that in Example 1 was used, and phase shifting mask blanks were manufactured in the same manner as in Example 1 except that the sputtering gas was replaced with a gas mixture containing argon, nitrogen and helium (gas flow rate: Ar=10 SCCM, $N_2$=60 SCCM, He=40 SCCM).

Figure 4:
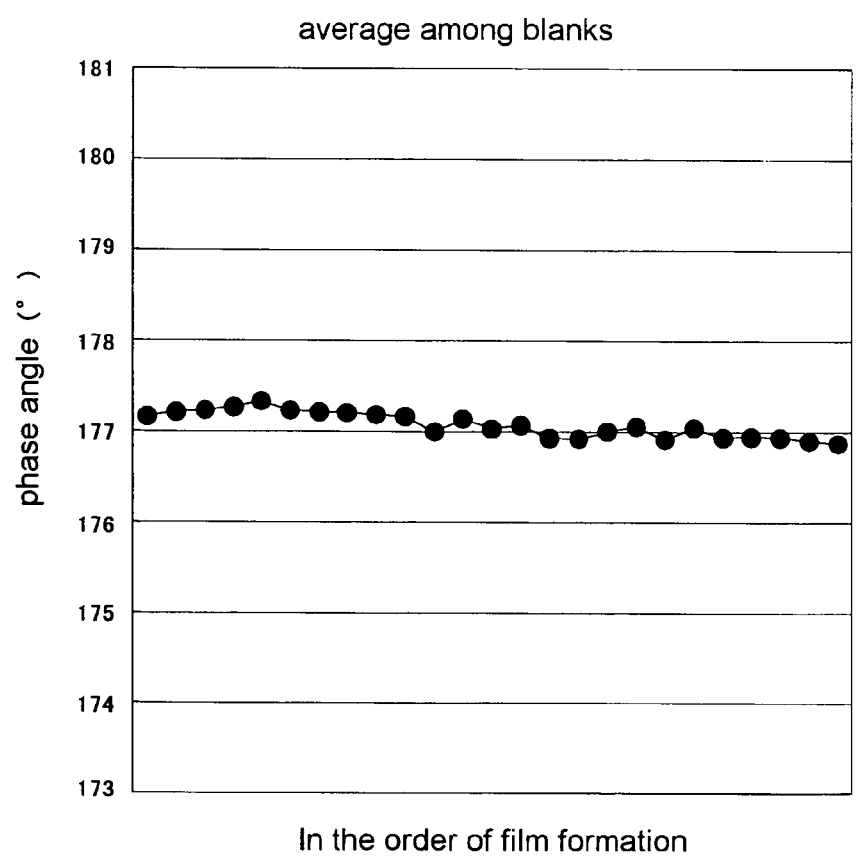
FIG. 4 is a graph showing variations of phase angles among half-tone phase shifting mask blanks obtained in Example 1.
Figure 5:
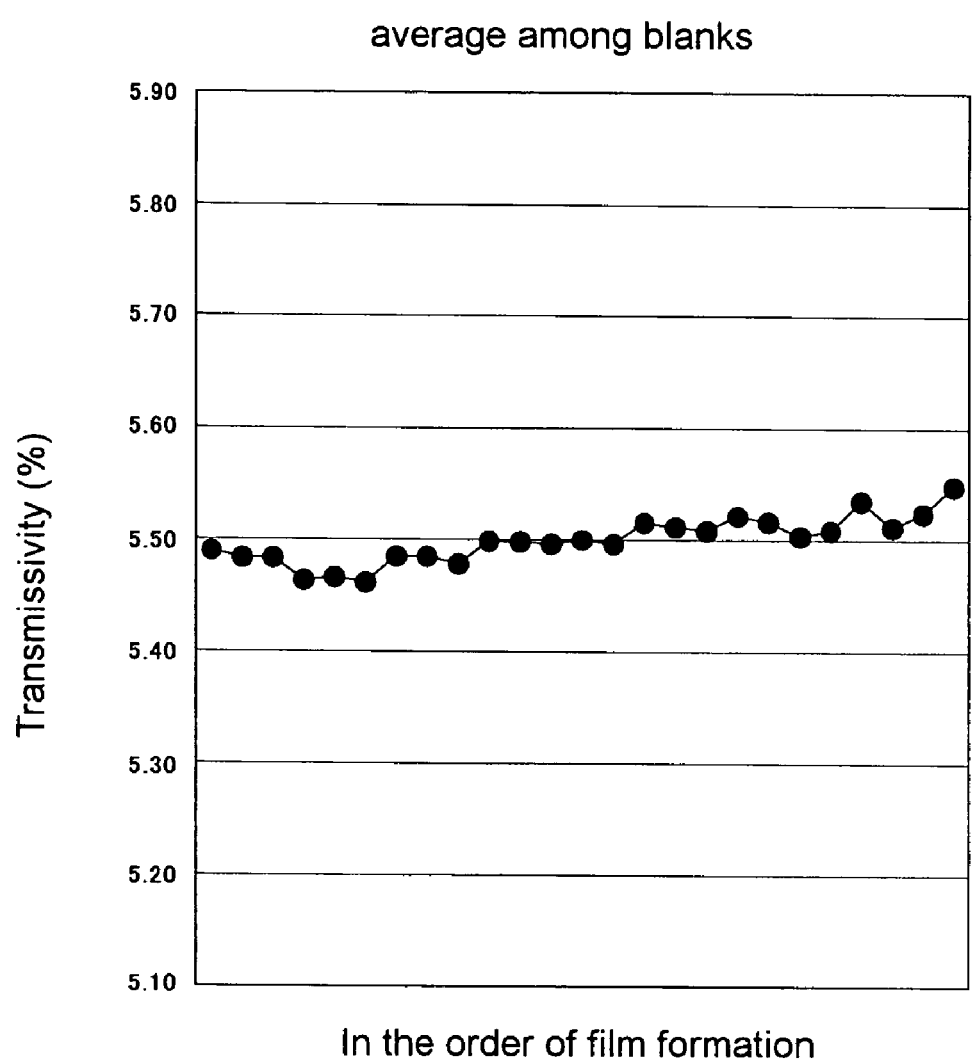
FIG. 5 is a graph showing variations of transmissivity among half-tone phase shifting mask blanks obtained in Example 1.

As a result, the variation of the phase angle among the blanks was within ±5° and that the variation of the transmissivity among the blanks was within ±1%. That is, value of one substrate measured. FIGS. 4 and 5 shows the results. These figures show that the variation of the phase angle among the blanks was within ±1° and that the variation of the transmissivity among the blanks was within ±0.1%. In this Example, there were mass-produced half-tone phase shifting mask blanks having stable optical properties for KrF excimer laser beam.

Example 2

A single-layered light semi-transmitting film composed substantially of molybdenum, silicon and nitrogen was formed on a transparent substrate with the same DC magnetron sputtering apparatus as that used in Example 1 by a single blank manufacturing method as described below. In this manner, 250 half-tone phase shifting mask blanks for ArF excimer laser beam (193 nm) were manufactured.

As a sputtering target, a target having an Mo:Si molar ratio of 10.0:90.0 was used, and as a sputtering gas, a gas mixture containing argon, nitrogen and helium under the same conditions as those in Example 1 was used (gas flow rate: Ar=10 SCCM, $N_2$=80 SCCM, He=40 SCCM). The light semi-transmitting films were formed such that the phase angles of the light semi-transmitting films were adjusted to about 180° in the wavelength of an ArF excimer laser beam.

Then, the blanks were heat-treated at 250° C. for 30 minutes in a heat-treatment apparatus.

The above phase shifting mask blanks (having a 15.2 the variations were greater than those in Example 1, and it was hence not possible to mass-produce half-tone phase shifting mask blanks having intended stable optical properties.

While the above Examples show embodiments of manufacturing two types of half-tone phase shifting mask blanks for the wavelengths of two exposure beams, half-tone phase shifting mask blanks for the wavelengths of two or more exposure beams or half-tone phase shifting mask blanks having different transmissivity values can be naturally mass-produced as well.

The sputtering apparatus shall not be limited to an apparatus according to the single blank manufacturing method described in Examples, and it may be an apparatus according to the in-line continuous blank manufacturing method.

Further, $N_2$ used as a reactive gas may be replaced with other reactive gas.

Further, in the above Examples, single-layered half-tone phase shifting mask blanks were manufactured. However, the present invention can be also applied to the formation of half-tone phase shifting mask blanks each having a multi-layered structure of two or more layers.

Effect of the Invention

According to the present invention, there can be provided a process for manufacturing half-tone phase shifting mask blanks, which enables the prevention of optical property variations when the blanks are mass-produced, half-tone phase shifting mask blanks obtained by the above process and half-tone phase shifting masks manufactured from the above mask blanks.

What is claimed is:

1. A process for manufacturing half-tone phase shifting mask blanks each having a phase shifting film containing at least one half-tone film on a transparent substrate,
comprising the step of providing a target containing a metal and silicon, and carrying out reactive sputtering in an atmosphere containing a reactive gas, to form said half-tone film on said transparent substrate,
wherein the formation of the half-tone film by said reactive sputtering is carried out using, as said target, a target having a metal/silicon compositional ratio selected so as to give a desired phase angle and transmissivity of the half-tone film, at a reactive gas flow rate selected from a region where a change in the discharge voltage is within about 20 V when the flow rate of the reactive gas changes by 10 SCCM (standard state $cm^3$/min).

2. The process of claim 1, wherein the reactive gas is at least one member selected from the group consisting of nitrogen, oxygen, fluorine and compounds of these.

3. A process for manufacturing a plurality of types of half-tone phase shifting mask blanks each of which has a phase shifting film containing at least one half-tone film on a transparent substrate, the half-tone film of each blank having a different optical property,
comprising the step of providing targets containing a metal and silicon and carrying out reactive sputtering in an atmosphere containing a reactive gas, to form said half-tone film on said transparent substrate,
wherein the formation of the half-tone film by said reactive sputtering is carried out using a target selected from a plurality of targets having different metal/silicon compositional ratios so as to give desired different phase angles and transmissivities among the mask blanks, at a reactive gas flow rate selected from a region where a change in the discharge voltage is within about 20 V when the flow rate of the reactive gas changes by 10 SCCM (standard state cm$^3$/min).

4. The process for manufacturing half-tone phase shifting mask blanks as recited in claim 1 or 3, wherein the metal/silicon compositional ratio of said target is selected from a region where said target has a silicon content of 70 to 95 mol %, to obtain desired optical properties of the half-tone film.

5. The process for manufacturing half-tone phase shifting mask blanks as recited in claim 1 or 3, wherein the metal/silicon compositional ratio of said target is selected from a region where said target has a silicon content of 85 to 95 mol %, to obtain desired optical properties of the half-tone film.

6. The process of claim 3, wherein each of the mask blanks produced has a transmission variation of ±0.4%.

7. The process of claim 3, wherein each of the mask blanks produced has a phase shifting amount variation of ±4°.

8. The process of claim 1 or 3, wherein the half-tone phase shifting mask blanks are mass-produced.

9. The process of claim 1 or 3, wherein each of the mask blanks produced has a transmission variation of no more than 1%.

10. The process of claim 1 or 3, wherein each of the mask blanks produced has a phase shifting amount variation of no more than ±5°.

11. A method of determining optimum conditions for forming a half-tone film in the manufacture of a plurality of types of half-tone phase shifting mask blanks which are for a plurality of wavelengths for exposure or which have different transmissivities, by carrying out reactive sputtering in an atmosphere containing a reactive gas using a target containing a metal and silicon, to form a phase shifting film containing at least one half-tone film on a transparent substrate, wherein the formation of the half-tone film by said reactive sputtering is carried out using, as said target, a plurality of types of targets whose metal/silicon compositional ratios are selected such that half-tone films having desired different phase angles and transmissivities are obtained, at a reactive gas flow rate selected from a region where a change in the discharge voltage is within about 20 V when the flow rate of the reactive gas changes by 10 SCCM (standard state cm$^3$/min).

12. The method of determining optimum conditions for forming a half-tone film as recited in claim 11, wherein the metal/silicon compositional ratios of said targets are determined in a region where said targets have a silicon content of 70 to 95 mol %, to give desired optical properties of the half-tone film.

13. The method of determining optimum conditions for forming a half-tone film as recited in claim 11, wherein the metal/silicon compositional ratios of said targets are determined in a region where said targets have a silicon content of 85 to 95 mol %, to give desired optical properties of the half-tone film.

14. A process for manufacturing half-tone phase shifting mask blanks, which comprises forming a phase shifting film containing at least one half-tone film on a transparent substrate under conditions determined according to the method recited in claim 11.

15. A process for manufacturing half-tone phase shifting masks, which comprises patterning the phase shifting films of the half-tone phase shifting mask blanks manufactured by the process recited in claim 14, to form mask patterns.

16. A process for manufacturing half-tone phase shifting mask blanks each having a phase shifting film containing at least one half-tone film on a transparent substrate, by providing a target containing a metal and silicon and carrying out reactive sputtering in an atmosphere containing a reactive gas to form said half-tone film on said transparent substrate, the process comprising the steps of determining a relationship between a reactive gas flow rate and a discharge characteristic of a sputtering apparatus in said reactive sputtering, determining reactive gas flow rate conditions capable of providing mask blanks having a transmission variation of ±0.4% and having a phase shifting amount variation of ±4°, on the basis of said relationship between the reactive gas flow rate and the discharge characteristic, forming half-tone films using targets having different metal/silicon compositional ratios under said reactive gas flow rate conditions determined, measuring the half-tone films for an optical property and determining a relationship between the compositional ratio of the metal and silicone in the target and the optical property of the half-tone film, determining a target composition having a metal/silicon compositional ratio that gives a predetermined optical property, on the basis of said relationship between the metal/silicon compositional ratio and the optical property of the half-tone film, and carrying out the reactive sputtering using a target having the thus-determined target composition under the thus-determined reactive gas flow rate conditions, to form the half-tone films on each transparent substrate.

17. A process for manufacturing a plurality of types of half-tone phase shifting mask blanks each of which has a phase shifting film containing at least one half-tone film on a transparent substrate, the half-tone film of each blank having a different optical property, by providing targets containing a metal and silicon and carrying out reactive sputtering in an atmosphere containing a reactive gas to form said half-tone film on said transparent substrate, the process comprising the steps of determining a relationship between a reactive gas flow rate and a discharge characteristic of a sputtering apparatus in said reactive sputtering, determining reactive gas flow rate conditions capable of providing mask blanks having a transmission variation of ±0.4% and having a phase shifting amount variation of ±4°, on the basis of said relationship between the reactive gas flow rate and the discharge characteristic, forming half-tone films using a plurality of targets having different metal/silicon compositional ratios under said reactive gas flow rate conditions determined, measuring the half-tone films for optical properties and determining relationships between the compositional ratios of the metal and silicone in the targets and the optical properties of the half-tone films, determining compositions of a plurality of different targets having metal/silicon compositional ratios that give predetermined different optical properties, on the basis of said relationships between the metal/silicon compositional ratios and the optical properties of the half-tone films, and carrying out the reactive sputtering using a plurality of different targets having the thus-determined target compositions under the thus-determined reactive gas flow rate conditions, to form the half-tone films.

18. The process of claim 16 or 17, wherein the optical property represents light transmissivity.

19. The process of claim 16 or 17, wherein the reactive gas is at least one member selected from the group consisting of nitrogen, oxygen, carbon, fluorine and compounds of these.

20. The process of claim 19, wherein the reactive gas is nitrogen.

21. The process of claim 16 or 17, wherein the discharge characteristic of the sputtering apparatus is a discharge voltage.

22. The process of claim 21, wherein said discharge characteristic stable region is a region where a change in the discharge voltage is within about 20 V when the flow rate of the reactive gas changes by 10 SCCM (standard state $cm^3$/min).

23. The process of claim 16 or 17, wherein the metal/silicon compositional ratio is determined in compositions having a silicon content of 70 to 95 mol % for obtaining a predetermined transmissivity of said half-tone film.

24. The process of claim 16 or 17, wherein the half-tone phase shifting mask blanks are mass-produced.

25. A process for the production of a half-tone phase shifting mask, which comprises patterning a phase shifting film of a half-tone phase shifting mask blank obtained by the process recited in claim 16 or 17 to form a phase shifting film pattern on the transparent substrate.

* * * * *